US009263350B2

(12) United States Patent
Kapoor et al.

(10) Patent No.: US 9,263,350 B2
(45) Date of Patent: Feb. 16, 2016

(54) MULTI-STATION PLASMA REACTOR WITH RF BALANCING

(71) Applicant: Lam Research Corporation, Fremont, CA (US)

(72) Inventors: Sunil Kapoor, Vancouver, WA (US); Karl F. Leeser, West Linn, OR (US); Adrien LaVoie, Newberg, OR (US); Yaswanth Rangineni, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/458,135

(22) Filed: Aug. 12, 2014

(65) Prior Publication Data

US 2015/0348854 A1 Dec. 3, 2015

Related U.S. Application Data

(60) Provisional application No. 62/007,350, filed on Jun. 3, 2014.

(51) Int. Cl.
*H01L 21/302* (2006.01)
*H01L 21/461* (2006.01)
(Continued)

(52) U.S. Cl.
CPC .......... *H01L 22/14* (2013.01); *C23C 16/45536* (2013.01); *C23C 16/45544* (2013.01); *C23C 16/505* (2013.01); *C23C 16/52* (2013.01); *H01J 37/32183* (2013.01); *H01J 37/32935* (2013.01); *H01L 21/0262* (2013.01); *H01J 2237/3321* (2013.01)

(58) Field of Classification Search
CPC .............. C23C 16/52; H01L 21/02274; H01L 21/0228; H01L 21/32055

USPC ............ 438/710, 729; 118/723 E, 723 I, 719; 427/569

See application file for complete search history.

(56) References Cited

U.S. PATENT DOCUMENTS 4,545,328 A * 10/1985 Fujiyama et al. .......... 118/723 E
4,695,327 A * 9/1987 Grebinski ......... H01L 21/02046
134/11

(Continued)

OTHER PUBLICATIONS

U.S. Appl. No. 61/994,025, filed May 15, 2014, entitled "Single ALD Cycle Thickness Control in Multi-Station Substrate Deposition Systems."

(Continued)

*Primary Examiner* — Mohsen Ahmadi
(74) *Attorney, Agent, or Firm* — Weaver Austin Villeneuve & Sampson LLP

(57) ABSTRACT

Methods and apparatus for multi-station semiconductor deposition operations with RF power frequency tuning are disclosed. The RF power frequency may be tuned according to a measured impedance of a plasma during the semiconductor deposition operation. In certain implementations of the methods and apparatus, a RF power parameter may be adjusted during or prior to the deposition operation. Certain other implementations of the semiconductor deposition operations may include multiple different deposition processes with corresponding different recipes. The recipes may include different RF power parameters for each respective recipe. The respective recipes may adjust the RF power parameter prior to each deposition process. RF power frequency tuning may be utilized during each deposition process.

12 Claims, 5 Drawing Sheets

(51) Int. Cl.
*H01L 21/66* (2006.01)
*H01L 21/02* (2006.01)
*C23C 16/455* (2006.01)
*C23C 16/505* (2006.01)
*C23C 16/52* (2006.01)
*H01J 37/32* (2006.01)

(56) References Cited

U.S. PATENT DOCUMENTS

| | | |
|---|---|---|
| 6,143,082 A | 11/2000 | McInerney et al. |
| 6,199,506 B1 | 3/2001 | Hilliker et al. |
| 7,042,311 B1 | 5/2006 | Hilliker et al. |
| 7,416,989 B1 | 8/2008 | Liu et al. |
| 7,977,249 B1 | 7/2011 | Liu et al. |
| 7,981,763 B1 | 7/2011 | van Schravendijk et al. |
| 8,058,179 B1 | 11/2011 | Draeger et al. |
| 8,187,486 B1 | 5/2012 | Liu et al. |
| 8,282,983 B1 * | 10/2012 | Kapoor et al. .................... 427/8 |
| 8,454,750 B1 | 6/2013 | Shrinivasan et al. |
| 2003/0056901 A1 * | 3/2003 | Nakano et al. .......... 156/345.47 |
| 2007/0034479 A1 | 2/2007 | Todaka |
| 2008/0237187 A1 * | 10/2008 | Dhindsa et al. ................. 216/71 |
| 2015/0000841 A1 * | 1/2015 | Yamada ............ H01J 37/32183 156/345.28 |

OTHER PUBLICATIONS

US Office Action dated Mar. 1, 2012 issued in U.S. Appl. No. 12/241,758.
US Notice of Allowance dated Aug. 29, 2012 issued in U.S. Appl. No. 12/241,758.

* cited by examiner

MULTI-STATION PLASMA REACTOR WITH RF BALANCING

CROSS-REFERENCE TO RELATED APPLICATIONS

This application claims priority benefit under 35 U.S.C. §119(e) to U.S. Provisional Application No. 62/007,350, filed Jun. 3, 2014, titled "MULTI-STATION PLASMA REACTOR WITH RF BALANCING," which is hereby incorporated by reference in its entirety.

BACKGROUND

Semiconductor device fabrication involves the processing of semiconductor wafers in a semiconductor processing reactor. Typical processes involve deposition and removal (i.e., etching) of material on the wafer. In commercial scale manufacturing, each wafer contains many copies of a particular semiconductor device being manufactured, and many wafers are required to achieve the required volumes of devices. The commercial viability of a semiconductor processing operation depends in large part upon within-wafer uniformity and wafer-to-wafer repeatability of the process conditions. Accordingly, efforts are made to ensure that each portion of a given wafer and each wafer processed are exposed to the same processing conditions. Variation in the processing conditions usually causes variation in deposition and etch rates resulting in unacceptable variation in the overall process and product. Techniques and apparatus to minimize process variation are required.

SUMMARY

In certain implementations, a method of plasma-assisted semiconductor deposition in multiple stations may be provided. The method may include: a) providing substrates at each of the multiple stations, b) distributing RF power to multiple stations to thereby generate a plasma in the stations, wherein the RF power is distributed according to a RF power parameter that is adjusted to reduce station to station variations, c) tuning a frequency of the RF power, and d) depositing a thin film on the substrate at each station. Tuning the frequency may include: i) measuring an impedance of the plasma, ii) determining, according to the impedance measured in operation (i), a change to the frequency of the RF power, and iii) adjusting the frequency of the RF power.

In some such implementations, the method determining an adjustment for adjusting the RF power parameter delivered to each station during operation (b). The adjustment may include measuring a RF power parameter at each station, comparing the RF power parameter at each station with a set point for each station, and determining a change to an RF adjuster to adjust the RF power parameter at each station such that the difference between the measurement and set point is reduced.

In some other or additional implementations, operation (i) may include measuring impedance as seen by a source of the RF power and operation (ii) may include determining a change to the frequency of the RF power such that the change to the frequency would result in a phase of the impedance as seen by the source of the RF power having zero value.

In some other or additional implementations, the RF power at each station during the depositing operation may be substantially the same.

In some other or additional implementations, the RF power distributed may be at a fixed frequency. In some such implementations, the fixed frequency may be a frequency of about 13.56 MHz. In some other or additional such implementations, the fixed frequency may be a preset frequency. In some such implementations, operation (i) may include measuring impedance as seen by a source of the RF power and the preset frequency may be a frequency calculated to result in a magnitude of the impedance as seen by the source of the RF power having a value of about 50 ohms.

In some other or additional implementations, tuning the frequency of the RF power may be performed over a duration of 10 seconds or less, 1 second or less, 500 milliseconds or less, or 150 milliseconds or less.

In some other or additional implementations, the thin film may be produced during a single ALD cycle. In some such implementations, operations (a) through (d) may be repeatedly performed, each time during a new ALD cycle. In some such implementations, the station-to-station distribution of the RF power parameter may not be changed over the multiple ALD cycles. In some other or additional such implementations, the tuning in operation (c) may produce a first RF power frequency in one ALD cycle and a second RF power frequency in another ALD cycle, such that the first and second RF power frequencies are different.

In certain implementations, a method of plasma-assisted semiconductor deposition in multiple stations may be provided. The method may include: providing a substrate at each of the multiple stations, wherein the multiple stations are within a chamber and performing at least a first and a second deposition process to produce first and second layers having different materials with different values of intrinsic properties. The first deposition process may be performed according to a first recipe having a first station-to-station adjustment for an RF power parameter, the second deposition process may be performed according to a second recipe having a second station-to-station adjustment for the RF power parameter, and the first adjustment for the RF power parameter of the first recipe may be different from the second adjustment for the RF power parameter of the second recipe. Each deposition process may include: a) distributing RF power to the multiple stations such that the RF power is distributed according to a RF power parameter that is adjusted to reduce station to station variations, b) tuning a frequency of the RF power, and c) depositing a thin film on the substrate at each station. Tuning the frequency may include: i) measuring an impedance of a plasma, ii) determining, according to the impedance measured in operation (i), a change to the frequency of the RF power, and iii) adjusting the frequency of the RF power.

In some such implementations, the method may further include determining an adjustment for adjusting the RF power parameter delivered to each station during operation (b). Determining the adjustment may include measuring a RF power parameter at each station, comparing the RF power parameter at each station with a set point for each station, and determining a change to an RF adjuster to adjust the RF power parameter at each station such that the difference between the measurement and set point is reduced.

In some other or additional implementations, operation (i) may include measuring impedance as seen by a source of the RF power and operation (ii) may include determining a change to the frequency of the RF power such that the change to the frequency would result in a phase of the impedance as seen by the source of the RF power having zero value.

In some other or additional implementations, the first and second deposition processes may be ALD deposition processes.

In certain implementations, an apparatus for plasma-assisted semiconductor depositions may be provided. The apparatus may include multiple deposition stations, a power source configured to provide RF power to the chamber to generate and maintain a plasma, an impedance sensor configured to measure plasma impedance, a RF frequency tuner configured to tune the RF power's frequency, one or more RF power adjusters configured to adjust the RF power distributed to the multiple deposition stations and thereby reduce station to station variations, and one or more controllers. Each of the deposition stations may include at least one wafer support and is configured to receive at least one substrate. The multiple deposition stations may be within a chamber. The one or more controllers, the power source, the impedance sensor, the RF frequency tuner, and the RF power adjusters may be communicatively connected. The controller may be configured to tune the RF power frequency and instruct the one or more RF power adjusters to adjust the RF power distributed to each station to reduce station-to-station variations. Tuning the RF power frequency may include: i) determining the impedance of the plasma via the plasma impedance measured by the impedance sensor, ii) determining, according to the impedance measured in operation (i), a change to the frequency of the RF power, and iii) adjusting the frequency of the RF power via the RF frequency tuner.

In some such implementations, operation (ii) may include determining a change to the frequency of the RF power such that the change to the frequency would result in a phase of the impedance having zero value.

In some other or additional implementations, the RF power adjuster may be selected from variable capacitors and variable coil inductors.

In some other or additional implementations, the impedance sensor may be configured to measure impedance as seen by the power source and operation (ii) may include determining a change to the frequency of the RF power such that the change to the frequency would result in a phase of the impedance as seen by the power source having zero value.

In some other or additional implementations, the RF power provided may be a fixed frequency. In some such implementations, the impedance sensor may be configured to measure impedance as seen by the power source and the fixed frequency is a frequency calculated to result in a magnitude of the impedance as seen by the power source having a value of about 50 ohms. In some such other or additional implementations, the fixed frequency is a frequency of about 13.56 MHz.

In some other or additional implementations, tuning the frequency of the RF power may be performed over a duration of 10 seconds or less, 1 second or less, 500 milliseconds or less, or 150 milliseconds or less. In certain implementations, an apparatus for plasma-assisted semiconductor depositions may be provided. The apparatus may include multiple deposition stations, a power source configured to provide RF power to the chamber to generate and maintain a plasma, an impedance sensor configured to measure plasma impedance, a RF frequency tuner configured to tune the RF power's frequency, one or more RF power adjusters configured to adjust the RF power distributed to the multiple deposition stations and thereby reduce station to station variations, and one or more controllers. Each of the deposition stations may include at least one wafer support and is configured to receive at least one substrate. The multiple deposition stations may be within a chamber. The one or more controllers, the power source, the impedance sensor, the RF frequency tuner, and the RF power adjusters may be communicatively connected. The controller may be configured to: perform at least a first and a second deposition process to produce first and second layers having different materials with different values of intrinsic properties such that the first deposition process is performed according to a first recipe having a first station-to-station adjustment of the RF power distributed and the second deposition process is performed according to a second recipe having a second station-to-station adjustment of the RF power distributed, tune the RF power frequency, and instruct the one or more RF power adjusters to adjust the RF power distributed to each station to reduce station-to-station variations. Tuning the RF power frequency may include: i) determining the impedance of the plasma via the plasma impedance measured by the impedance sensor, ii) determining, according to the plasma impedance measured in operation (i), a change to the frequency of the RF power, and iii) adjusting the frequency of the RF power via the RF frequency tuner. The first adjustment for the RF power distributed according to the first recipe is different from the second adjustment for the RF power distributed according to the second recipe.

DETAILED DESCRIPTION

Figure 1:
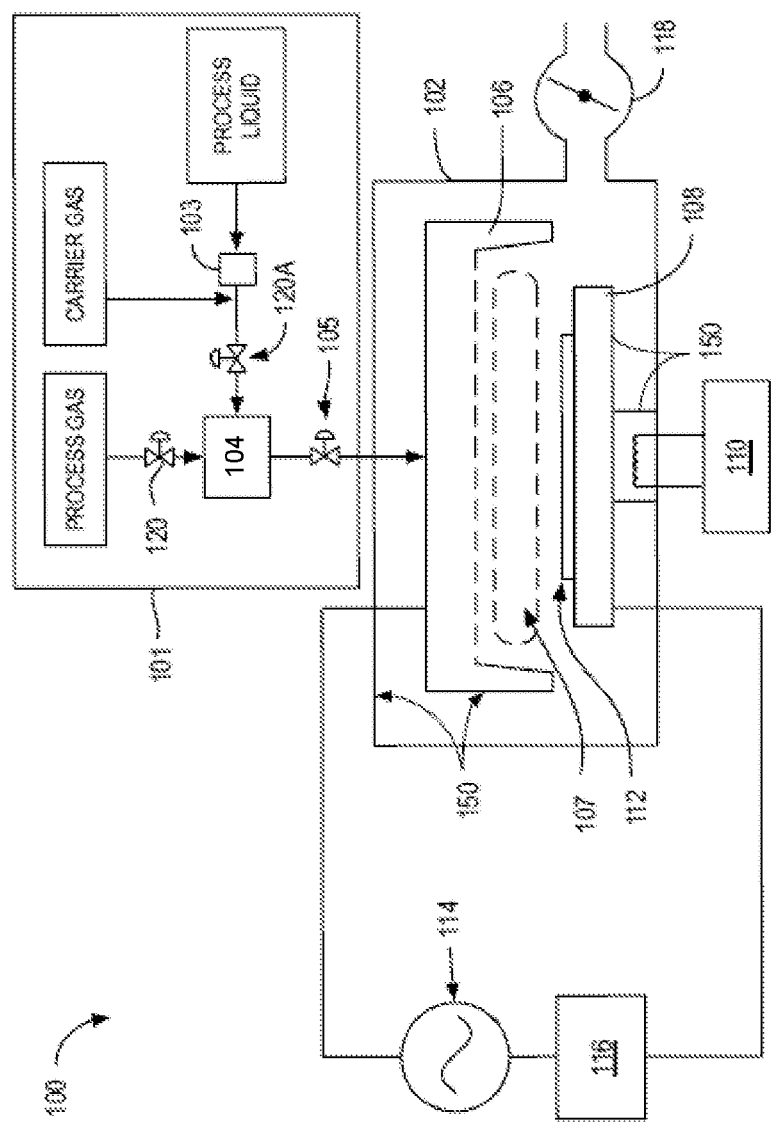
FIG. 1 shows a substrate processing apparatus for depositing films on semiconductor substrates.

In the following detailed description, numerous specific implementations are set forth. However, as will be apparent to those skilled in the art, the techniques and apparatus disclosed herein may be practiced without these specific details or by using alternate elements or processes. In other instances, well-known processes, procedures and components have not been described in detail so as not to unnecessarily obscure aspects of the present disclosure.

Disclosed herein are methods and apparatuses for improving thin film deposition on semiconductor substrates, such as deposition consistency, in semiconductor fabrication operations involving multiple film deposition cycles, each producing a "discrete" film thickness. Atomic layer deposition (ALD) is one such film deposition method, but any technique which puts down thin layers of film and used in a repeating sequential matter may be viewed as involving multiple cycles of deposition, and the methods and apparatuses disclosed herein may also be used generally for controlling film thickness in such multi-cycle deposition operations.

As device and features size continue to shrink in the semiconductor industry, and also as 3D devices structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:
1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

The duration of each ALD cycle is typically less than 25 seconds or less than 10 seconds. The plasma exposure step (or steps) of the ALD cycle may be of a short duration, such as a duration of 1 second or less. Due to the short duration, control of plasma consistency can promote process uniformity. Variations in plasma impedance and power delivered are two factors which may affect process uniformity.

Apparatus and methods are provided to control RF power used in multi-cycle deposition operations in a semiconductor tool with multiple processing stations that share an RF power source. The frequency of the RF power and the power applied to individual stations that share an RF power source are controlled.

FIG. 1 shows a substrate processing apparatus for depositing films on semiconductor substrates. The apparatus 100 of FIG. 1 has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1. The apparatus schematically illustrated in FIG. 1 provides the basic equipment for performing film deposition operations such as chemical vapor deposition (CVD) or ALD on semiconductor substrates.

Figure 2:
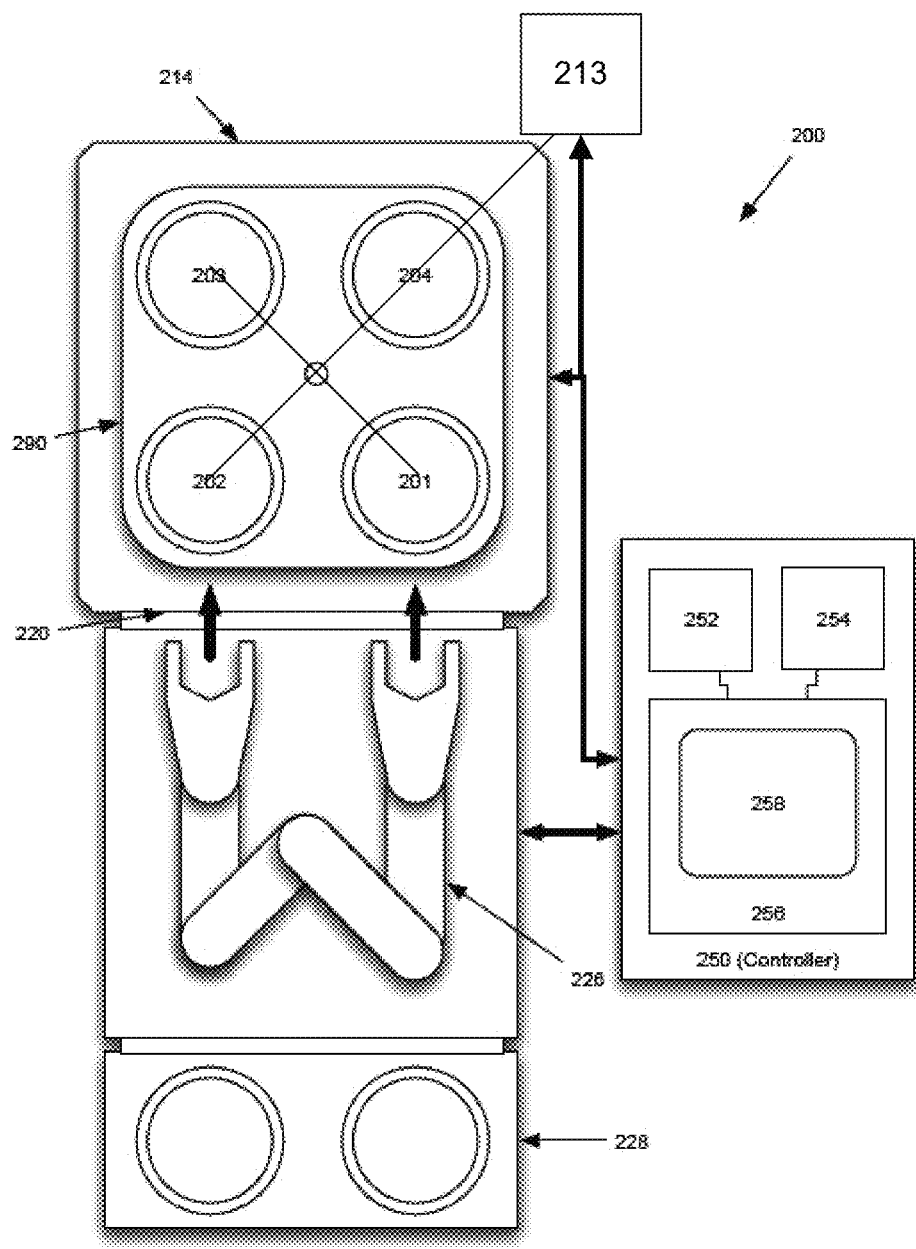
FIG. 2 shows an example multi-station substrate processing apparatus that may utilize plasma balancing hardware.

For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool. Further, it will be appreciated that, in some implementations, one or more hardware parameters of processing apparatus 100, including those discussed in detail above, may be adjusted programmatically by one or more system controllers.

Process station 100 fluidly communicates with reactant delivery system 101 for delivering process gases to a distribution showerhead 106. Reactant delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The implementation of FIG. 1 includes a vaporization point 103 for vaporizing liquid reactant to be supplied to mixing vessel 104. In some implementations, vaporization point 103 may be a heated liquid injection module. In some other implementations, vaporization point 103 may be a heated vaporizer. In yet other implementations, vaporization point 103 may be eliminated from the process station.

In some implementations, a liquid flow controller (LFC) upstream of vaporization point 103 may be provided for controlling a mass flow of liquid for vaporization and delivery to processing chamber 102.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1, substrate 112 is located beneath showerhead 106, and is shown resting on a pedestal 108. Showerhead 106 may have any suitable shape, and may have any suitable number and arrangement of ports for distributing processes gases to substrate 112.

A volume 107 is located beneath showerhead 106. In some implementations, pedestal 108 may be raised or lowered to expose substrate 112 to volume 107 and/or to vary a volume of volume 107. Optionally, pedestal 108 may be lowered and/or raised during portions the deposition process to modulate process pressure, reactant concentration, etc. within volume 107.

In FIG. 1, showerhead 106 and pedestal 108 are electrically connected to RF power supply 114 and matching network 116 for powering a plasma. In some implementations, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Likewise, RF power supply 114 may provide RF power of any suitable frequency.

In some implementations, the plasma may be monitored in-situ by one or more plasma monitors. In one scenario, plasma power may be monitored by one or more voltage, current sensors (e.g., load sensors such as VI probes). Examples of such sensors include MKS VI-Probe-4100 and 350. Such sensors may measure the voltage, current, and phase differences. In certain implementations, the sensors may be electrically connected to the RF power supply and may be located at or near the showerhead. In such implementations, the impedance, as seen by the RF power supply may be representative of the impedance of the plasma. In another scenario, plasma density and/or process gas concentration may be measured by one or more optical emission spectroscopy (OES) sensors. In some implementations, one or more plasma parameters may be programmatically adjusted based on measurements from such in-situ plasma monitors. For example, a load sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, the plasma may be controlled via input/output control (IOC) sequencing instructions. In one example, the instructions for setting plasma conditions for plasma activation may be included in a corresponding plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, with 25 milliseconds being a specific example. Such short RF plasma strikes require quick stabilization and tuning of the plasma. To accomplish the quick stabilization and tuning of the plasma, the plasma generator may be configured through a two-step tuning process that includes a coarse tuning component and a fine tuning component. In the coarse tuning component, the impedance match may be preset to a particular impedance. The coarse tuning component may be preset such that a magnitude of the impedance is at a value of, for example, 50 ohms. In certain implementations, the coarse tuning component may be limited to adjustments affecting the magnitude of the impedance. In the fine tuning component, the RF frequency may be allowed to float from a baseline frequency in order to attempt to match the phase to a target value, such as a phase value of zero. Conventionally, high-frequency plasmas are generated at an RF frequency of about 13.56 MHz. In various implementations disclosed herein, the frequency may be allowed to float to a value that is different from this standard value in order to match the phase to the target value. In certain implementations, the fine tuning component may be limited to adjustments affecting the phase of the impedance. By permitting the frequency to float while fixing the impedance match to a predetermined impedance, the plasma can stabilize much more quickly. Very short plasma strikes, such as strikes associated with ALD or atomic layer etching (ALE) cycles, may benefit from quick stabilization of the plasma.

The first 1-2 milliseconds of a typical deposition cycle involve the ignition of the plasma. After ignition of the plasma, the fine tuning of the RF frequency is then carried out to match the plasma phase to the target value.

As described above, one or more process stations may be included in a multi-station substrate processing tool. FIG. 2 shows an example multi-station substrate processing apparatus that may utilize plasma balancing hardware. Various efficiencies may be achieved through the use of a multi-station processing apparatus like that shown in FIG. 2 with respect to both equipment cost and operational expenses. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus 200 of FIG. 2 employs a single substrate processing chamber 214 that contains multiple substrate process stations, each of which may be used to perform processing operations on a substrate held in a wafer holder at that process station. In this particular implementation, the multi-station substrate processing apparatus 200 is shown having four process stations 201, 202, 203, and 204. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 226 and a controller 250.

As shown in FIG. 2, the multi-station processing tool 200 has a substrate loading port 220, and a robot 226 configured to move substrates from a cassette loaded through a pod 228 through atmospheric port 220, into the processing chamber 214, and onto one of the four stations 201, 202, 203, or 204.

The depicted processing chamber 214 shown in FIG. 2 provides four process stations, 201, 202, 203, and 204. The RF power is generated at an RF power system 213 and distributed to each of the stations 201-04. The RF power system may include one or more RF power sources, e.g., a high frequency (HFRF) and a low frequency (LFRF) source, impedance matching modules, and filters. In certain implementation, the power source may be limited to only the high frequency or low frequency source. Unless otherwise stated, assume that the described deposition processes employ only high frequency power. The distribution system of the RF power system is symmetric about the reactor and has high impedance. This symmetry and impedance result in approximately equal amounts of power being delivered to each station. Small differences in RF power, in the order of 5 to 15%, may arise from tolerances in distribution system components, station alignments, temperature differences, and process conditions.

Small differences in RF power can cause wafer-to-wafer non-uniformity in a variety of film characteristics, e.g., composition, thickness, density, amount of cross-linking, chemistry, reaction completion, stress, refractive index, dielectric constant, hardness, etch selectivity, stability, hermeticity, etc. The ability to fine-tune plasma power at individual stations and to dynamically respond to changing station conditions may decrease wafer-to-wafer non-uniformity. Note that the present method and apparatus are not limited to a multi-station reactor; the method and apparatus disclosed herein applies to other RF power systems where multiple processing areas share an RF power source.

FIG. 2 also depicts an implementation of a substrate transferring device 290 for transferring substrates between process stations 201, 202, 203, and 204 within processing chamber 214. It will be appreciated that any suitable substrate transferring device may be employed. Non-limiting examples include wafer carousels and wafer handling robots.

FIG. 2 also depicts an implementation of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some implementations, system controller 250 controls some or all of the operations of process tool 200 including the operations of its individual process stations. System controller 250 may execute machine-readable system control instructions 258 on processor 252—the system control instructions 258, in some implementations, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components. System control instructions 258 may be coded in any suitable computer readable programming language. In some implementations, system control instructions 258 are implemented in software, in other implementations, the instructions may be implemented in hardware—for example, hard-coded as logic in an ASIC (application specific integrated circuit), or, in other implementations, implemented as a combination of software and hardware.

In some implementations, system control software 258 may include input/output control (IOC) sequencing instructions for controlling the various parameters described above. For example, each step of a deposition process or processes may include one or more instructions for execution by system controller 250. The instructions for setting process conditions for a primary film deposition process, for example, may be included in a corresponding deposition recipe, and likewise for a capping film deposition. In some implementations, the recipes may be sequentially arranged, so that all instructions for a process are executed concurrently with that process.

Other computer-readable instructions and/or programs stored on mass storage device 254 and/or memory device 256 associated with system controller 250 may be employed in some implementations. Examples of programs or sections of programs include a substrate positioning program, a process gas control program, a pressure control program, a heater control program, and a plasma control program.

In some implementations, there may be a user interface associated with system controller 250. The user interface may include a display screen, graphical software displays of the apparatus and/or process conditions, and user input devices such as pointing devices, keyboards, touch screens, microphones, etc.

In some implementations, parameters adjusted by system controller 250 may relate to process conditions. Non-limiting examples include process gas compositions and flow rates, temperatures, pressures, plasma conditions (such as RF bias power levels, frequencies, and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, load sensors, OES sensors, etc. Appropriately programmed feedback and control algorithms may be used with data from these sensors to maintain process conditions.

System controller 250 may provide machine-readable instructions for implementing deposition processes. The instructions may control a variety of process parameters, such as DC power level, RF bias power level, station-to-station variations such as RF power parameter variations, frequency tuning parameters, pressure, temperature, etc. The instructions may control the parameters to operate in-situ deposition of film stacks according to various implementations described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

Various other configurations for multi-cycle deposition processes and multi-station semiconductor processing apparatuses are described in U.S. Provisional Patent Application No. 61/994,025, filed May 15, 2014, and are hereby incorporated by reference.

Figure 3:
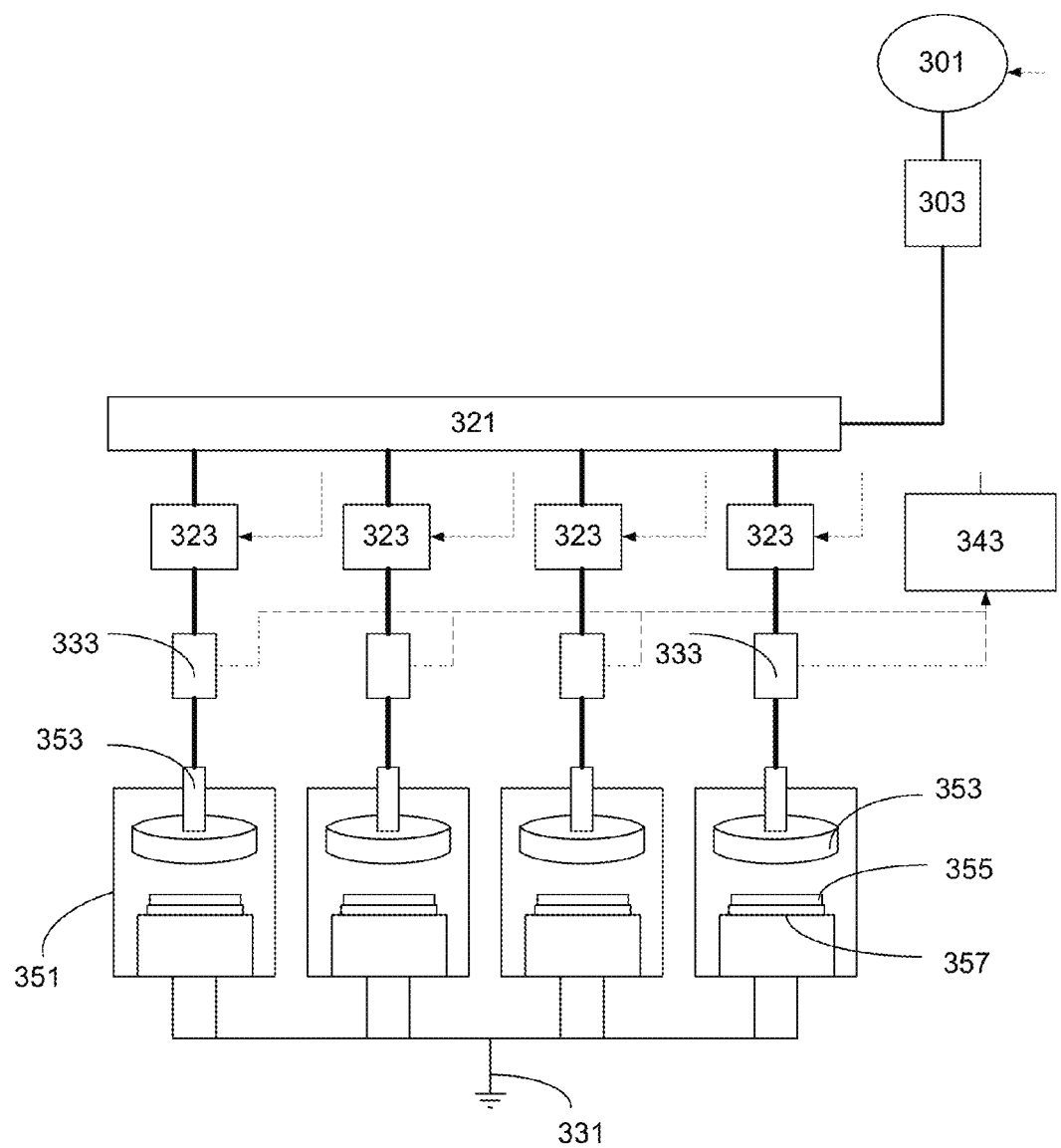
FIG. 3 is a schematic diagram showing various components in an example multi-station plasma reactor with multiple stations sharing a RF power source utilizing RF frequency tuning.

FIG. 3 is a schematic diagram showing various components in an example multi-station plasma reactor with multiple stations sharing a RF power source utilizing RF frequency tuning. As shown, a RF power source 301, which may be a high frequency RF power source, is distributed via a distribution network 321 to multiple stations 351. The HFRF may have a frequency of about 2-60 MHz, or about 13.56 MHz. In other implementations, a low frequency RF power source may be used in addition to or in place of the high frequency RF power source. The low frequency RF power source may have a frequency of about 100 kHz to about 1 MHz, or about 400 kHz. Certain commercially available RF power sources include the ability to tune the frequency of the RF power. Examples of such RF power sources include Advanced Engineer's Paramount series, MKS's SurePower series, Comdel's CB, CLX, and CDX series, and Huettinger's TruPlasma series.

The power from the RF power source 301 may be routed through an impedance matching system that may include a fixed match module 303. In certain implementations that contain both the high and the low frequency RF power source, a high pass filter and/or a low pass filter may also be present. Additionally, in certain implementations, the power from the RF power source may be routed through an auto match module. Implementations that include the low frequency RF power source, whether in addition to or in place of the high frequency RF power source, low frequency power may be routed through either a fixed or auto match. In certain implementations, an auto match module may be used to match the RF power frequency to a set impedance of a load of the plasma. In other implementations, a fixed match module, which does not automatically match the RF power frequency to a set impedance of a load of the plasma, may be used.

In the implementation shown in FIG. 3, the RF power source 301 is connected to the distribution network 321. The distribution network 321 may distribute the RF power generated by the RF power source 301 to each of the multiple stations 351. The distribution network 321 is connected to a RF adjuster 323 for each of the multiple stations 351. For each of the multiple stations 351, the RF adjuster 323 is connected to a power parameter sensor 333 before the showerhead 353. The power parameter sensor 333 may be a sensor of any type previously disclosed, such as a load sensor or an OES sensor. The RF power source 301 may obtain instructions from the RF controller 343 and vary the frequency of the RF power distributed to the stations. The instructions may be a frequency adjustment according to the impedance as detected by the one or more power parameter sensors 333. In other implementations, an additional sensor may measure a final phase that is representative of the phase of the plasmas in all of the stations 351. The RF controller 343 may then vary the frequency of the RF power distributed to the station according to the final phase measured by the additional sensor. In certain implementations, the RF controller 343 may include instructions, e.g., code, to vary the frequency of the RF power such that the phase of the impedance is zero or near zero. In the implementation shown in FIG. 3, the RF controller 343 may vary the frequency of the RF power from the RF power source 301 upstream of the individual stations.

The RF adjuster 323 is controlled by RF controller 343. RF controller 343 may change the RF power at individual stations by a determined amount based on the measurement from the sensors 333 at each station 351. In certain implementations, the RF adjusters 323 may be variable capacitors. The RF controller 343 may control a stepper motor (not shown) that can vary the capacitance of a variable capacitor. Other ways to vary a capacitance may be used. For example, the RF adjusters 323 may also be a bank of capacitors with individual switches. The RF power may be controlled by activating (turning on) a number of capacitors having a specified value. For example, capacitors may be selected to add 1 pF, 2 pF, 4 pF, 8 pF, and 16 pF shunt capacitance to the station. In this example, all combinations of active (turned on) and non-active (turned off) capacitors cover the range from 0 pF to 31 pF with 1 pF resolution. By selecting which capacitors to activate, the controller can change the RF power to a station. This digital control can be faster than using a stepper motor to control a variable capacitor, especially when a wide range of capacitance needs to be covered. Depending on the space available and the amount of control required, one skilled in the art would be able to design a RF adjuster using one or more capacitors to change RF power by a certain amount.

In other implementations, the RF adjusters 323 may be variable coil inductors. The RF controller 343 may control the variable coil inductors to affect RF power delivered to the station. In certain implementations, the RF adjusters are not limited to capacitor and inductors. In certain implementations, other RF adjusters 323 may utilize different mechanisms to change the RF power, such as resonator circuits or resistive circuits.

The sensors 333 measure at least one RF power parameter. The RF power parameter measured may be voltage, current, impedance, phase, or load power. Commercially available probes may be used to measure the RF power parameter and provide the measurement to the RF controller 343. It is also possible to measure a non-RF parameter and use it as source signal for the RF controller 343. For example, optical emission from station plasma or substrate temperature sensors can measure station characteristics and feed them to the adjuster controller 343. An optical emission system may be installed in the vicinity of each station to collect light emitted by station plasma. A substrate temperature sensor may use remote infrared detection system built under a substrate. The sensor 333 may also measure multiple RF power parameters, or multiple sensors may be used in certain implementations to measure multiple RF power parameters.

In some implementations, the RF adjusters may be set to a fixed value or range of values over multi-step processes such as a multi-cycle ALD process. In such implementations, there is little or no need for real-time sensing of the RF power parameter(s) and adjustment of the station-to-station distribution of RF power.

Each station 351 contains a showerhead 353 working in conjunction with a grounded pedestal 357. The power and frequency supplied is sufficient to generate a plasma from the process gas, for example within the range of about 50-6,000 W per station. Power levels may vary according to the implementation. RF power is connected to the station processing area via the showerhead 353 and generates or sustains a plasma when RF power is applied. The plasma causes material to be deposited onto the substrate by a variety of mechanisms. For example, the plasma can cause process gas to break down and react on the substrate surface. In the implementation shown, the RF current is grounded at the pedestals 357, which are connected to the ground 331. In certain other implementations, the RF current may be grounded at a different location in the chamber such as at the showerheads.

The semiconductor tools previously described may be used for plasma balancing. Plasma balancing may be especially beneficial in a multi-cycle deposition process with short cycle durations such as ALD and atomic layer etching (ALE). Atomic layer etching methods are further discussed in the following U.S. Patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

The plasma activation step of multi-step deposition processes with short cycle durations may be brief. The duration of the plasma activation step may be about 150 milliseconds or less (e.g., about 50 milliseconds). Due to the short durations, control of plasma consistency has an effect on process uniformity. Plasma balancing may be used to control plasma consistency.

Figure 4A:
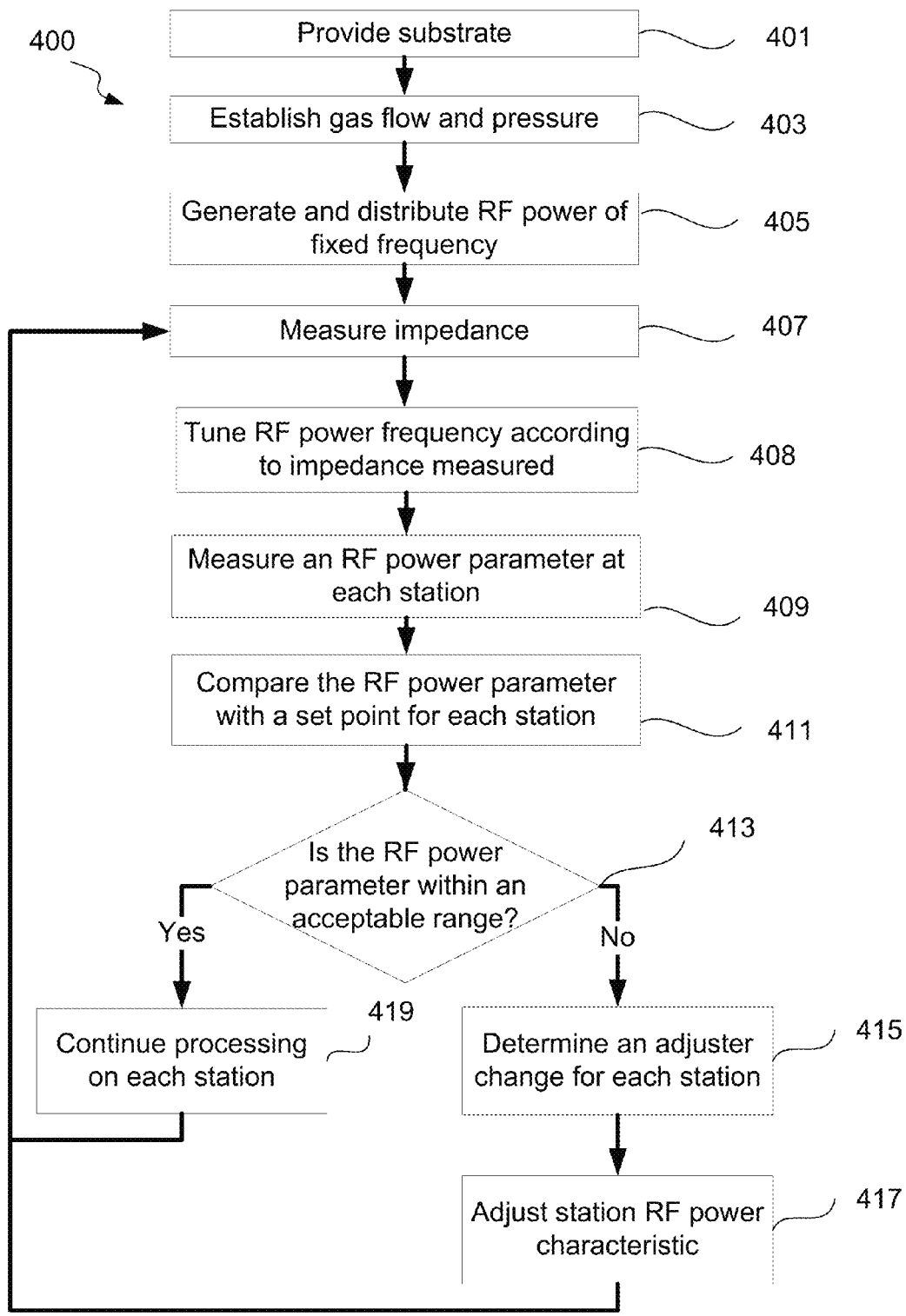
FIG. 4A is a process flow diagram of a multi-station deposition process utilizing RF frequency tuning and RF power parameter adjustment.

FIG. 4A is a process flow diagram of a multi-station deposition process utilizing RF frequency tuning and RF power parameter adjustment. The process described in FIG. 4A may be applicable to a variety of steps in deposition processes, such as step 3 of the ALD cycle which was previously described. Although the process is discussed in the context of a deposition procedure, elements of the process may be applied to any plasma-assisted semiconductor process.

In operation 401, a substrate is provided. Substrates may be provided to one or more stations of a multi-station tool. Substrates may be provided through the loading of a station with a substrate or the substrate may already be in the station due to a previous operation, such as from a previous cycle.

After a substrate is provided, gas flow is established in operation 403 and pressure is stabilized at a set point. Operation 405 starts the generation of RF power. The RF power may be HFRF, LFRF, or both HFRF and LFRF. Before operation 405, the impedance between the electrode, typically the showerhead, and the substrate may be very high, similar to the impedance of an open circuit. In operation 405, the RF power may be generated and applied to ignite the plasma. The RF power may be applied such that the magnitude of the impedance is fixed at a certain resistance, such as a resistance of 50 ohms. The RF power may be applied at a fixed frequency. The fixed frequency may be a pre-determined frequency of RF power. In certain other implementations, the frequency of the RF power generated in operation 405 may not be according to a fixed frequency. In such implementations, the frequency in operation 405 may be varied in a variety of ways, such as through algorithms, user input, feedback from previous operations of the deposition process, etc. In certain implementations, operation 405 may last for a limited duration, such as a period of less than 5 milliseconds.

After the plasma has been ignited properly, the process may continue to operation 407. Full power may be delivered from operation 407 onward. Operations 407-19 are repeated for the remaining duration of the step of the deposition process. Hence, if the process of FIG. 4A is used in step 3 of the ALD cycle, operations 407-19 are repeated until the end of step 3. In operation 407, the impedance of the plasma may be measured. During the process described in FIG. 4A, chemical reactions and changes in the environmental conditions within the processing station may lead to changes in the impedance of the plasma. Impedance may be measured by any sensor typically used to measure impedance of plasmas. The impedance measured may be impedance as seen by a source of the RF power. The impedance as seen by the source of the RF power may be measured by the sensors described elsewhere in this disclosure herein. For example, a load sensor conductively connected to the source of the RF power may measure the impedance as seen by the source of the RF power.

In operation 408, the frequency of the RF power may be tuned according to the impedance measured in step 407. Certain implementations of the semiconductor processing tool may include a controller and associated instructions for matching RF power frequencies to detected impedances. The instructions may be based on plots, may be according to formulas, or other methods of calculating the required RF power frequency. For example, the RF power frequency may be tuned such that the phase of the impedance is as close to a zero value as possible. As the impedance changes during semiconductor processing, the RF power frequency may be adjusted accordingly in operation 408. In certain implementations, the impedance may be measured as an average of the impedance at each station. Other implementations may include the ability to measure the impedance at each individual station. As previously mentioned, operations 407 and 408 are continuously performed until the end of the deposition process step due to the potential for changes in the impedance.

In operation 409, a RF power parameter may be measured at each station to determine variations among the stations. The RF power parameter may be measured after plasma is generated in the station and reflects the dynamic impedances in each station. This parameter may be a voltage, current, impedance, phase, load power, power delivered to the station, or any combination of the previous.

The RF power parameter measurements may be compared with a set point for each station in operation 411. In certain implementations of RF power balancing, the set points may be the same for every cycle of the deposition process. In other implementations, the set points may vary between cycles of the deposition process. For example, the set points may be an average of the measured power delivered to each station. In yet other implementations, the set points may be different at each station. This comparison may be performed at a local controller, a central controller for RF adjusters, or at a system control for the entire tool.

The total RF power delivered to the all stations that share a common RF source depends on the power set point at the RF generator, the impedance of the plasma load and the impedance of RF network. The RF adjusters affect primarily station-to-station power distribution. Adjuster effects on total power are usually secondary. In certain cases, depending on the type of RF adjuster used, a reduction in RF power of one station may increase RF power in other stations. In those cases the controller may determine an adjustment taking station-station RF power interactions into account or simply repeat the adjustment many times until the measurements are within a threshold margin to the set point.

In certain cases an absolute RF power level is desired. In this case, RF power can be measured at each station and then two adjustments executed. For example, first, total power at the generator output is changed to match the sum of station set points. Second, the station RF adjusters are tuned to split power according to the set points. The order of adjustments (total power vs. split) may be reversed. The procedure is repeated until power split is within a threshold margin to the set points.

In operation 413, the measured RF power parameter distribution may be compared with the set point(s). If the difference is higher than a threshold, then an adjuster change at each station may be determined at operation 415. The adjuster change needed may vary station by station. Certain stations may require no adjuster change at all while other stations may require an adjuster change. This adjuster change may be determined by the RF controller or another controller. Note that the parameter or RF characteristic to be adjusted may be different from the RF power parameter measured. In one example, RF power may be measured and capacitance or impedance adjusted.

The needed adjuster change may be applied to adjust a station RF characteristic at operation 417. In certain implementations, the station impedance may be adjusted by the adjuster change amount in operation 417. The impedance and station RF power parameter may then be measured again starting from operation 407 and the adjustment cycles of the RF power frequency and the power parameter may continue until the deposition process has finished.

If the power parameter measured in operation 411 and compared in operation 413 is within an acceptable range, the semiconductor processing continues in operation 419. The process may then continue starting from operation 407 until the deposition process has finished.

In various implementations, the sequence of operations 407-19 may be arranged in different orders. For example, operation 409 (and possibly operations 409-19) may be performed before operation 407. In other implementations, operations 407-08 may be performed concurrently with operations 409-19. In yet other implementations, the measurement operations 407 and 409 may be performed before the tuning and adjustment operations 408 and 411-19.

In the power balancing context, continuous RF power control during processing may be needed for at least two reasons. One possibility is following an intentional RF power curve. The set points may vary over time during a processing sequence. The RF adjusters may be used to maintain specific power distribution as set points vary. In another possibility, the station RF power may have tendency to drift during processing and needs to be adjusted based on dynamic feedback.

In certain implementations, a semiconductor processing operation may include multiple different deposition processes in a single multistation reactor. The multiple different deposition processes may deposit different materials, particularly layers of material such as a barrier layer or a nucleation layer in contact with an underlying substrate, a bulk layer on top of the nucleation layer, a capping layer on top of the bulk layer, etc. These individual layers may have relatively similar (or different) compositions. In some cases, the different deposition processes may use different process gases. When a semiconductor processing operation has multiple different deposition processes, different recipes are typically used for the different deposition processes. In such cases, different RF power parameter set points for individual stations may be used for the different recipes. In certain implementations, the differences in the set points would result in variations between the initial adjuster setting for the different recipes. Such initial adjuster settings may be contained in or a part of the recipes for the deposition processes. The different recipes of the different deposition processes may reflect the variations in the initial adjuster settings of the different processes. In such cases, the initial adjuster settings for the separate processes may be determined through prior simulation or testing results. In certain implementations, the RF power frequency that is first generated and distributed to the stations may be at different per-station power settings for the individual recipes. In such implementations, the RF adjusters may be further tuned during the deposition process according to the techniques described herein. In certain embodiments, the initial adjuster position may be an adjuster position that is calculated to result in the least amount of RF adjuster tuning when the deposition process is performed over multiple cycles.

Figure 4B:
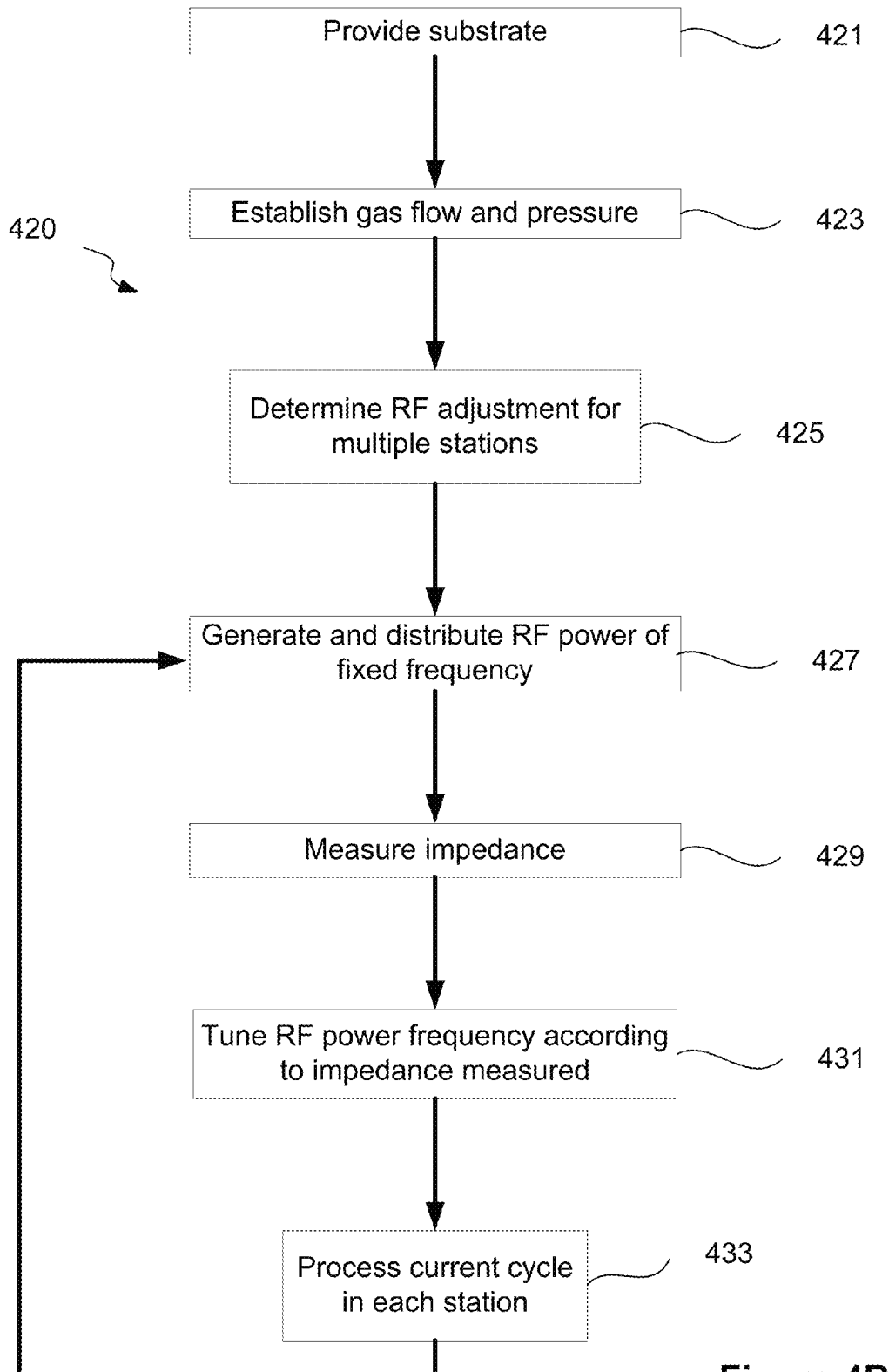
FIG. 4B is a process flow diagram of a multi-station deposition process utilizing RF frequency tuning.

FIG. 4B is a process flow diagram of a multi-station deposition process utilizing RF frequency tuning FIG. 4B is similar to FIG. 4A, however while FIG. 4A describes a process utilizing both RF frequency tuning and RF power parameter adjustment during the deposition process, FIG. 4B describes a process utilizing only RF frequency tuning during the deposition process.

Process flow diagram of FIG. 4B may be a process utilized for a deposition process utilizing RF frequency tuning. Certain implementations may use the process illustrated in FIG. 4B for an individual deposition process of a semiconductor processing operation that includes multiple different deposition processes. The multiple different deposition processes may deposit different materials as described herein. In other embodiments, only a single deposition process is used. Either way, the station-to-station RF power adjustment is fixed and may be set prior to the deposition process. Typically, the process does not employ feedback of an RF power parameter to determine appropriate RF power adjustment during deposition.

In process flow diagram 420 of FIG. 4B, operations 421 and 423 are similar to operations 401 and 403 of FIG. 4A, respectively. In operation 425 of FIG. 4B, RF adjustments for the multiple stations are determined. The RF adjustments for the multiple stations are determined prior to generation of RF power and the processing of the substrates. The RF adjustments may be determined via historical data, calculations, or trial and error.

After the RF adjustment has been performed in operation 425, the process may proceed to operation 427. Operations 427, 429, and 431 are similar to operations 405, 407, and 408 of FIG. 4A, respectively. In operation 433, the current cycle is processed for each station and the process is then repeated for the desired number of cycles. During each of the desired number of cycles, operations 427, 429 and 431 are repeated so that the RF power frequency is continuously tuned according to the requirements of the impedance measured. The RF power frequency may be tuned according to the techniques described elsewhere in this disclosure herein.

Various other configurations and apparatus for power balancing for multi-station semiconductor processing apparatuses are described in U.S. Pat. No. 8,282,983, issued Oct. 9, 2012, which is incorporated herein by reference in its entirety.

What is claimed is:

1. A method of cyclic plasma-assisted semiconductor deposition processing in multiple stations in a process chamber of a substrate processing apparatus, the method comprising:
 a) providing substrates at each of the multiple stations;
 b) distributing RF power to multiple stations to thereby generate a plasma in the stations, wherein the RF power is distributed according to a RF power parameter that is adjusted to reduce station to station variations;
 c) tuning a frequency of the RF power, wherein tuning the frequency includes:
  i) measuring an impedance of the plasma,
  ii) determining, according to the impedance measured in (i), a change to the frequency of the RF power, and
  iii) adjusting the frequency of the RF power; and
 d) depositing a thin film on the substrate at each station, wherein:
 the thin film is produced during a single ALD cycle,
 (b) through (d) are repeatedly performed, each time during a new ALD cycle of the semiconductor deposition processing,
 each ALD cycle comprises igniting the plasma and temporarily delivering one or more process gases to the process chamber,
 the station-to-station distribution of the RF power parameter is not changed over the multiple ALD cycles, and
 the tuning in (c) produces a first RF power frequency in one ALD cycle and a second RF power frequency in another ALD cycle, and wherein the first and second RF power frequencies are different.

2. The method of claim 1, further comprising determining an adjustment for adjusting the RF power parameter delivered to each station during (b), wherein determining the adjustment includes:
 measuring a RF power parameter at each station;
 comparing the RF power parameter at each station with a set point for each station; and
 determining a change to an RF adjuster to adjust the RF power parameter at each station such that the difference between the measurement and set point is reduced.

3. The method of claim 1, wherein i) comprises measuring impedance as seen by a source of the RF power and ii) comprises determining a change to the frequency of the RF power such that the change to the frequency would result in a phase of the impedance as seen by the source of the RF power having zero value.

4. The method of claim 1, wherein the RF power at each station during the depositing operation is substantially the same.

5. The method of claim 1, wherein the RF power distributed is at a fixed frequency.

6. The method of claim 5, wherein the fixed frequency is a preset frequency.

7. The method of claim 6, wherein i) comprises measuring impedance as seen by a source of the RF power and the preset frequency is a frequency calculated to result in a magnitude of the impedance as seen by the source of the RF power having a value of about 50 ohms.

8. The method of claim 5, wherein the fixed frequency is a frequency of about 13.56 MHz.

9. The method of claim 1, wherein tuning the frequency of the RF power is performed over a duration of 10 seconds or less.

10. A method of cyclic plasma-assisted semiconductor deposition processing in multiple stations, the method comprising:
providing a substrate at each of the multiple stations, wherein the multiple stations are within a chamber;
performing at least a first and a second deposition process to produce first and second layers having different materials with different values of intrinsic properties, wherein:
the first deposition process is performed according to a first recipe having a first station-to-station adjustment for an RF power parameter,
the second deposition process is performed according to a second recipe having a second station-to-station adjustment for the RF power parameter,
each deposition process includes:
a) distributing RF power to the multiple stations, wherein the RF power is distributed according to a RF power parameter that is adjusted to reduce station to station variations;
b) tuning a frequency of the RF power, wherein tuning the frequency includes:
i) measuring an impedance of a plasma,
ii) determining, according to the impedance measured in (i), a change to the frequency of the RF power, and
iii) adjusting the frequency of the RF power; and
c) depositing a thin film on the substrate at each station,
the first adjustment for the RF power parameter of the first recipe is different from the second adjustment for the RF power parameter of the second recipe, and for the first layer:
the thin film is produced during a single ALD cycle,
(a) through (c) are repeatedly performed, each time during a new ALD cycle of the semiconductor deposition processing,
each ALD cycle comprises igniting the plasma and temporarily delivering one or more process gases to the process chamber,
the station-to-station distribution of the RF power parameter is not changed over the multiple ALD cycles, and
the tuning in (b) produces a first RF power frequency in one ALD cycle and a second RF power frequency in another ALD cycle, and wherein the first and second RF power frequencies are different.

11. The method of claim 10, further comprising determining an adjustment for adjusting the RF power parameter delivered to each station during (b), wherein determining the adjustment includes:
measuring a RF power parameter at each station;
comparing the RF power parameter at each station with a set point for each station; and
determining a change to an RF adjuster to adjust the RF power parameter at each station such that the difference between the measurement and set point is reduced.

12. The method of claim 10, wherein i) comprises measuring impedance as seen by a source of the RF power and ii) comprises determining a change to the frequency of the RF power such that the change to the frequency would result in a phase of the impedance as seen by the source of the RF power having zero value.

* * * * *